US008601765B2

(12) United States Patent
Lord

(10) Patent No.: US 8,601,765 B2
(45) Date of Patent: Dec. 10, 2013

(54) LOCKING SYSTEM

(75) Inventor: Nathan Lord, Hertfordshire (GB)

(73) Assignee: Aeroflex Limited, Hertfordshire (GB)

( * ) Notice: Subject to any disclaimer, the term of this patent is extended or adjusted under 35 U.S.C. 154(b) by 0 days.

(21) Appl. No.: 13/253,510

(22) Filed: Oct. 5, 2011

(65) Prior Publication Data

US 2012/0079791 A1 Apr. 5, 2012

(30) Foreign Application Priority Data

Oct. 5, 2010 (GB) .................................. 1016747.6

(51) Int. Cl.
*E04B 2/00* (2006.01)

(52) U.S. Cl.
USPC ........... 52/582.2; 52/79.9; 312/263; 312/111; 312/140

(58) Field of Classification Search
USPC .......... 52/582.1, 582.2, 79.9; 312/111, 265.5, 312/257.1, 263, 108, 140
See application file for complete search history.

(56) References Cited

U.S. PATENT DOCUMENTS

| 1,625,612 | A | | 4/1927 | Jensen |
| 4,154,030 | A | | 5/1979 | Huguet |
| 5,179,810 | A | * | 1/1993 | Gename et al. ................. 52/240 |
| 5,531,535 | A | * | 7/1996 | Lind ............................. 403/297 |
| 5,666,713 | A | * | 9/1997 | Kubota ....................... 29/525.01 |
| 5,970,675 | A | * | 10/1999 | Schray ......................... 52/582.1 |
| 7,418,805 | B2 | * | 9/2008 | Tan .............................. 52/582.2 |
| 8,147,162 | B1 | * | 4/2012 | Burnett et al. ................. 403/292 |
| 8,306,583 | B2 | * | 11/2012 | Symons et al. ............. 455/575.3 |
| 8,356,446 | B2 | * | 1/2013 | Takeda et al. ................. 52/79.12 |

FOREIGN PATENT DOCUMENTS

| DE | 3140290 | 4/1983 |
| DE | 19949694 | 4/2001 |
| EP | 0117205 | 8/1984 |
| EP | 1344950 | 9/2003 |
| FR | 1338108 | 8/1963 |
| FR | 2445871 | 8/1980 |
| FR | 2616183 | 12/1988 |
| GB | 1111627 | 5/1968 |
| WO | 9504228 | 2/1995 |
| WO | 9834032 | 8/1998 |

OTHER PUBLICATIONS

International Property Office Search Report for Application No. GB1016747.6 dated Feb. 4, 2011, 3 sheets.
International Search Report for Application No. PCT/RO 97/00001 dated Sep. 24, 1997, 3 sheets.

* cited by examiner

*Primary Examiner* — William Gilbert
*Assistant Examiner* — Gisele Ford
(74) *Attorney, Agent, or Firm* — Banner & Witcoff, Ltd.

(57) ABSTRACT

Components of a modular component system are disclosed. A representative component has, at a first side, a first channel for receiving a connector and, at a second side, a second channel for receiving a connector. The first channel extends inwardly from an outer edge of the first side and in cross-section has a body portion which extends from an opening in the component in a direction generally parallel to the first side and a head portion which extends outwardly of the body portion. The second channel extends inwardly from an outer edge of the second side and in cross-section has a body portion which extends from an opening in the component in a direction generally parallel to the second side and a head portion which extends outwardly of the body portion.

20 Claims, 14 Drawing Sheets

LOCKING SYSTEM

CROSS REFERENCE TO RELATED APPLICATIONS

This application claims priority to Great Britain Application GB 1016747.6, filed Oct. 5, 2010. This application is incorporated herein by reference in its entirety.

TECHNICAL FIELD

The present invention relates to a locking system for modular component systems, and in particular to a locking system for a system comprising a plurality of pieces of electronic equipment such as test instruments.

BACKGROUND

Electronic equipment such as test instruments is commonly supplied in cases of standard dimensions. For example, electronic test instruments are often supplied in cases which are 19 inches wide (full-size) or half-size cases which are 9½ inches wide. Such instruments may be freestanding or may be mounted in a rack of standard dimensions.

In complex systems, a number of different pieces of electronic equipment may be required. Typically the different pieces of equipment are stacked on top of another, or are mounted in a rack.

It is known for pieces of equipment to be provided with locating features such as indents in an upper surface which can receive complementary formations such as projections provided on feet of other pieces of equipment. This facilitates stacking of the individual pieces of equipment, but does not inseparably lock the pieces of equipment together. Thus, systems where a number of individual pieces of equipment are stacked in this manner can be unstable and vulnerable to toppling if disturbed, which can lead to damage to the individual pieces of equipment. Additionally it can be difficult and time consuming to transport systems of this type, as the individual pieces of equipment may have to be disengaged from each other and transported separately, since the equipment may not be stable enough to transport in its stacked configuration.

Although it is known for pieces of equipment to be provided with features to facilitate stacking of the pieces of equipment, no such features are provided to facilitate attaching known half-size (or full-size) pieces of equipment together securely in a side by side configuration for rack-mounting or for free-standing use, and thus in order to attach such pieces of equipment together in a side-by side configuration ad-hoc solutions may be employed, which may not be sufficiently secure.

SUMMARY

According to a first aspect of the invention there is provided a component of a modular component system, the component having at a first side thereof a first channel for receiving a connector and at a second side thereof a second channel for receiving a connector, wherein the first channel extends inwardly of an outer edge of the first side and in cross-section has a body portion which extends from an opening in the component in a direction generally parallel to the first side and a head portion which extends outwardly of the body portion; and the second channel extends inwardly of an outer edge of the second side and in cross-section has a body portion which extends from an opening in the component in a direction generally parallel to the second side and a head portion which extends outwardly of the body portion.

Components according to the first aspect of the present invention can quickly and easily be securely locked together, for example in a side by side or stacked configuration to facilitate movement of the components or their assembly into larger systems containing many components.

The first channel may extend inwardly to a greater depth than the second channel. For example, the first channel may extend inwardly to twice the depth of the second channel.

This asymmetric arrangement of the first and second channels permits standard connectors, which may be supplied with the components, to be used to lock together any two (or more) components according to the first aspect of the present invention.

The first and second channels may each be provided with a threaded bore which extends inwardly into the component in a direction generally parallel to a side of the component for receiving a threaded fastener.

The first channel may be provided with two threaded bores which extend inwardly into the component in a direction generally parallel to a side of the component for receiving threaded fasteners.

The first channel and the second channel may each be provided with a threaded bore which extends inwardly into the component in a direction generally perpendicular to a side of the component for receiving a threaded fastener.

The use of threaded bores and complementary threaded fasteners provides a strong and secure means for maintaining connectors in position, whilst also facilitating the process of locking components together and unlocking components from each other, since no special tools are required.

The first and second channels may be generally T-shaped in cross-section.

Channels having a generally T-shaped cross-section have a plurality of bearing surfaces against which connectors can bear to provide a strong and secure connection between components which will resist relative movement of the connected components in different directions.

The component may further comprise a first connector which is removably received in the first channel and a second connector which is removably received in the second channel.

By providing the connectors in situ in the channels the connectors are always present when required, thus facilitating the process of locking components together.

The component may further comprise a foot having a first side and a second side, the first side being provided with a threaded aperture and the second side being provided with a through bore for receiving a threaded fastener. The foot of the component provides a second means of locking components together, thereby increasing the stability and security of a connection between components.

The through bore may be enlarged on an inner face of the second said. The foot may be generally L-shaped. Alternatively, the foot may be generally C-shaped. The component may be, for example, a piece of electronic test equipment.

According to a second aspect of the invention there is provided a connector for connecting components of a modular system according the first aspect of the invention, the connector having a body portion and a head portion which extends outwardly of the body portion.

The connector may have a through bore which extends through the connector in a direction generally perpendicular to an upper surface of the connector.

The connector may have two through bores which extend through the connector in a direction generally perpendicular to an upper surface of the connector. Each through bore may be countersunk. The connector may be generally T-shaped in cross-section. Alternatively, the connect may be generally I-shaped in cross-section.

The connector may have through bores which extend through the connector in a direction generally parallel to an upper surface of the connector. The through bores may be countersunk.

According to a third aspect of the invention there is provided a modular component system comprising a component according to the first aspect of the invention and a connector according to the second aspect of the invention.

According to a fourth aspect of the invention there is provided a fascia for a component of a modular system, the fascia having at a first side thereof a first channel for receiving a connect and at a second side thereof a second channel for receiving a connector, wherein the first channel extends inwardly of an outer edge of the first side and in cross-section has a body portion which extends from an opening in the fascia in a direction generally parallel to the first side and a head portion which extends outwardly of the body portion; and the second channel extends inwardly of an outer edge of the second side and in cross-section has a body portion which extends from an opening in the fascia in a direction generally parallel to the second side and a head portion which extends outwardly of the body portion.

According to a fifth aspect of the invention there is provided a foot for a component of a modular system, the foot having a first side and a second side, the first side being provided with a threaded aperture and the second side being provided with a through bore for receiving a threaded fastener. The through bore may be enlarged on an inner face of the second side. The foot may be generally L-shaped. Alternatively, the foot may be generally C-shaped.

BRIEF DESCRIPTION OF THE DRAWINGS

Illustrative aspects in accordance with the invention will be described in detail with reference to the following figures wherein.

DETAILED DESCRIPTION

Figure 1:
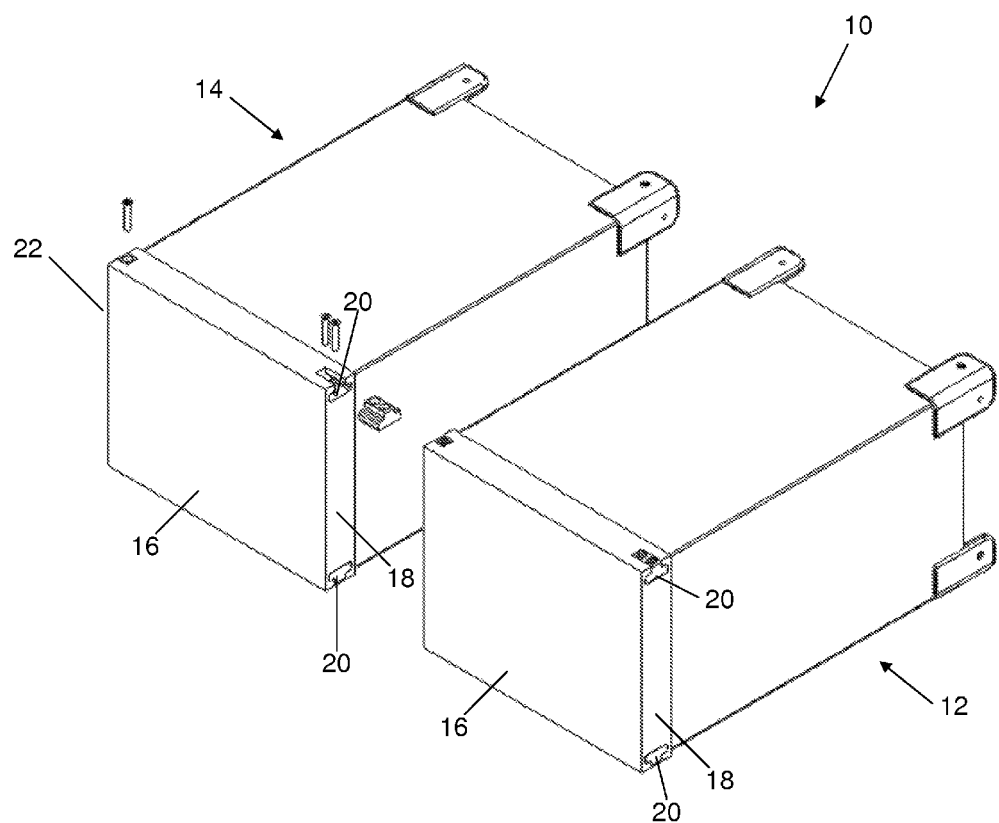
FIG. 1 is a schematic perspective view of two pieces of electrical equipment forming image-forming device of the invention.

Referring first to FIG. 1, a modular component system is shown generally at 10, and includes first and second components 12, 14. In this example the components 12, 14 are items of electrical equipment such as electronic test instruments, but it will be appreciated that the principles of the present invention are applicable to any modular component system in which it is desirable to be able to lock components together securely.

Figure 2:
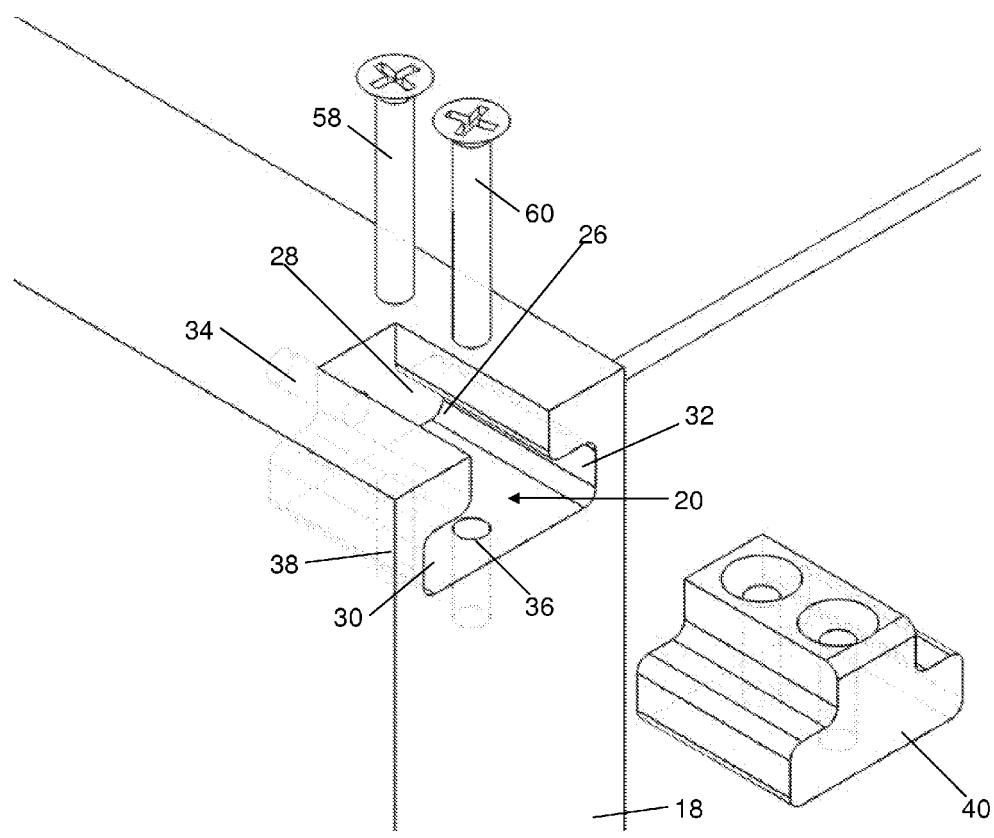
FIG. 2 is a side cross-sectional view of a drum subunit provided in the color laser printer of FIG. 1 on which a developer cartridge is mounted.
Figure 3:
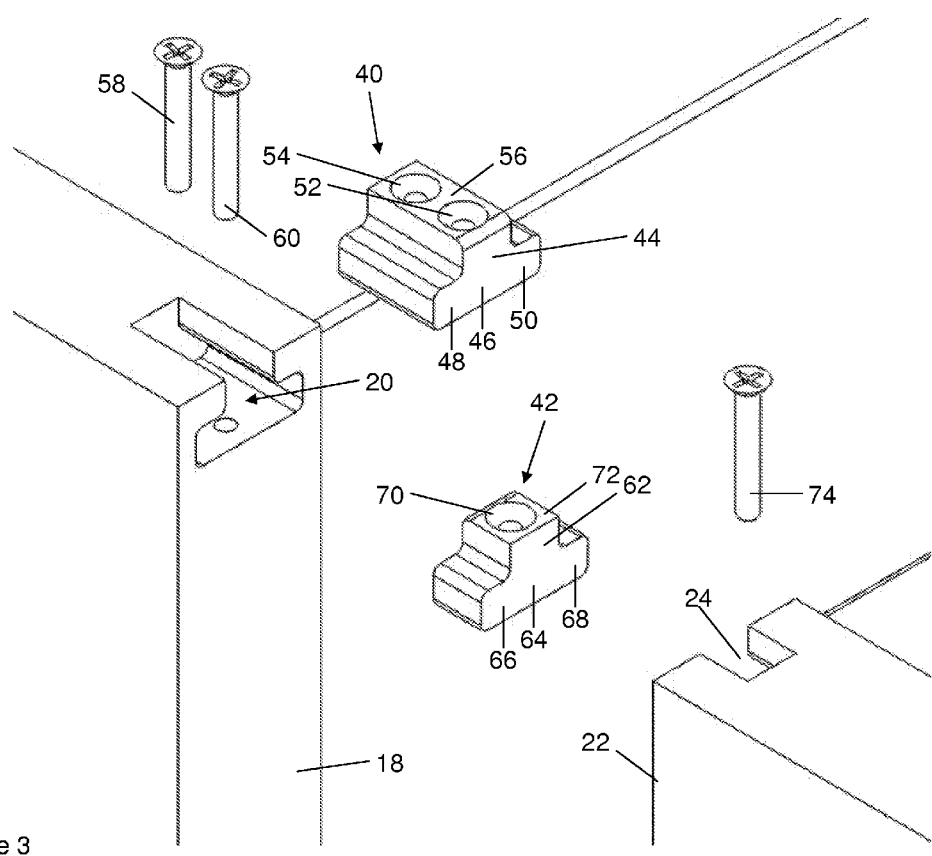
FIG. 3 is a schematic perspective view of parts of both of the pieces of electrical equipment shown in FIG. 1.

The first and second components 12, 14, each have a fascia 16, which, as can be seen in FIG. 2, is provided at a first side 18 with a first channel 20 extending inwardly of an upper part of the first side 18 for receiving a connector which can be used to lock the component 12, 14 to a complementary component 14, 12, as will be described below. An upper part of a second side 22 of the fascia is provided with a second channel 24 which extends inwardly of the second side 22, as can be seen in FIG. 3, for receiving a connector which can be used to lock the component 12, 14, to a complementary component 14, 12. As can be seen in FIG. 1, similar channels are provided in lower parts of the first and second sides 18, 22 of the fascia 16. These lower channels are inverted versions of the first and second channels 20, 24 described below and thus will not be described here in detail.

The first and second channels 20, 24 are generally T-shaped in cross-section, having a body portion 26 which extends from an opening in an upper surface of the fascia 16 in a direction generally parallel to the side 18, 22 of the fascia 16, and opens into an enlarged head portion 28 which is wider than the body portion 26 and has arms 30, 32 which extend in opposite directions laterally outwardly of the body portion 26.

The first channel 20 and the second channel 24 are of different widths, that is to say the first channel 20 and the second channel 24 extend into the fascia 16 to different depths. In this example the first channel 20 is twice as wide as the second channel 24, but it is to be appreciated that any ratio of widths could be employed, provided that one of the channels 20, 24 is wider than the other.

The first channel 20 is provided with a threaded bore 34 which extends inwardly into the component 12, 14 in a direction generally perpendicular to the side 18 of the fascia 16 and is configured to receive a threaded fastener such as a screw or bolt to retain a connector received in the first channel 20, for example when two stacked components are to be locked together, as will be described below.

The first channel 20 also has two threaded bores 36, 38, which extend into the component 12, 14 in a direction generally parallel to the side 18 of the fascia 16. The bores 36, 38 are configured to receive threaded fasteners such as screws or bolts to retain a connector or connectors received in the first channel 20, for example when two components are to be locked together in a side by side configuration, as will be described below.

The second channel 24 is also provided with a threaded bore extending inwardly into the component 12, 14 in a direction generally perpendicular to the side 20 of the fascia 16, which bore is configured to receive a threaded fastener such as a bolt or screw to retain a connector received in the second channel 24, for example when two stacked components are to be locked together.

As the second channel 24 in this example is half the width of the first channel 20 the second channel 24 is provided with a single threaded bore which extends into the component 12, 14 in a direction generally parallel to the side 20 of the fascia 16 and is configured to receive a threaded fastener such as a bolt or screw to retain a connector received in the second channel 24, for example when two components are to be locked together in a side by side configuration.

Each of the components 12, 14 is provided with a first connector 40 and a second connector 42, which are shown most clearly in FIG. 3.

The first connector 40 is configured to be received in the first channel 20, and is generally T-shaped in cross-section. The first connector 40 has a body portion 44 which terminates in an enlarged head portion 46 which is wider than the body portion 44 and has arms 48, 50 which extend in opposite directions laterally outwardly of the body portion 44.

The first connector 40 is provided with two countersunk bores 52, 54 which extend through the first connector 40 in a direction generally perpendicular to an upper surface 56 of the first connector 40, and are positioned such that when the first connector 20 is received in the first channel 20 the bores 52, 54 align with the bores 36, 38 of the first channel 20 such that threaded bolts or screws 58, 60 can be passed through the first connector 40 to be received in the threaded bores 36, 38 of the first connector 20 to retain the first connector 40 in place within the first channel 20.

The second connector 42 is configured to be received in the second channel 24, and is thus half of the width of the first connector 40. Like the first connector 40 the second connector 42 is generally T-shaped in cross-section, having a body portion 62 which terminates in an enlarged head portion 64 which is wider than the body portion 62 and has arms 66, 68 which extend laterally outwardly of the body portion 60 in opposite directions.

As the second connector 42 is half the width of the first connector 40, it is provided with a single countersunk bore 70 which extends through the second connector 42 in a direction generally perpendicular to an upper surface 72 of the second connector 42 and is positioned such that when the second connector 42 is received in the second channel 24 the bore 68 aligns with the bore of the second channel 24 such that a threaded bolt or screw 74 can be passed through the second connector 42 to be received in the threaded bore of the second channel 24 to retain the second connector 42 in place within the second channel 24.

The bores in the first and second connectors 40, 42 are countersunk so that when the bolts or screws 58, 60, 74 are received in the bores of the first and second channels 20, 24 to retain the first and second connectors 40, 42 in the first and second channels 20, 24 the heads of the bolts or screws 58, 60, 74 lie flush with the upper surfaces 56, 72 of the first and second connectors 40, 42. The first and second connectors 40, 42 are shaped and dimensioned such that when they are received in the first and second channels 20, 24 their upper surfaces 56, 72 lie flush with or just below a surface of the fascia 16 so as to produce a smooth finish.

When the components 12, 14 are to be used in isolation the first and second connectors 40, 42 are received in the first and second channels 20, 24 and retained in place by the bolts or screws 58, 60, 74. The first and second connectors 40, 42 are moved when two components 12, 14 are to be locked together in a side by side configuration, as will be described below with reference to FIGS. 1-7.

As is shown in FIG. 1, a first step in the process of locking the first and second components 12, 14 together in a side by side configuration is the removal of the first connector 40 from the first channel 20 of the second component 14, by removing the bolts or screws 58, 60 to allow the first connector 40 to slide out of the first channel 20 of the second component, as shown in FIG. 2.

The second connector 42 of the first component 12 is then removed from the second channel 24 of the first component 12 in the same manner, as shown in FIG. 3.

Figure 4:
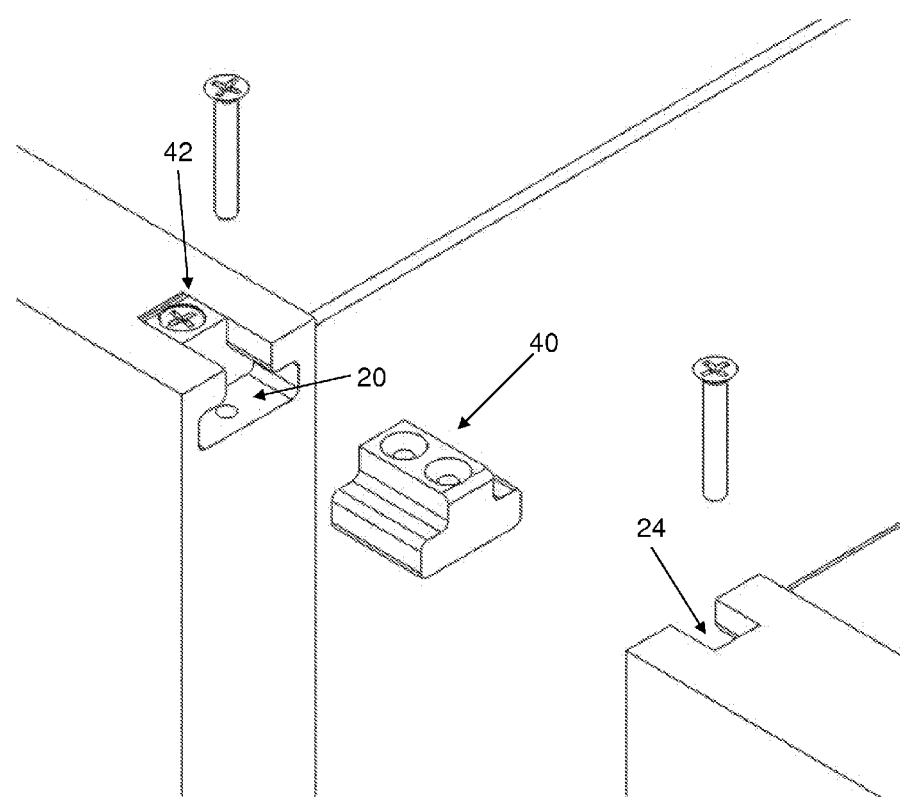
FIG. 4 is a schematic perspective view of the parts of the pieces of electrical equipment shown in FIG. 3, illustrating a step in a process of locking the pieces of electrical equipment together.

The second connector 42 of the first component 12 is then inserted into the first channel 20 of the second component 14 and secured in place using one of the bolts or screws 58, 60, 74, as shown in FIG. 4. As the second connector 42 is half the width of the first channel 20, it does not occupy the whole of the first channel 20.

Figure 5:
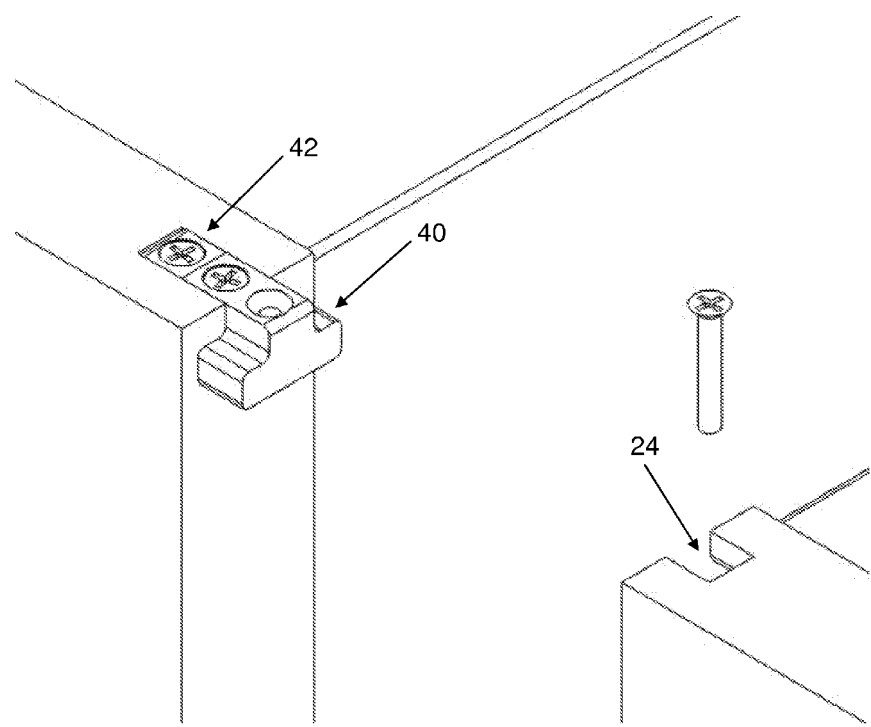
FIG. 5 is a schematic perspective view of the parts of the pieces of electrical equipment shown in FIG. 3, illustrating a further step in the process of locking the pieces of electrical equipment together.

The first connector 40 is then inserted into the first channel 20 of the second component 14. As the second connector 42 is already installed in the first channel 20, half of the first connector 40 protrudes outwardly of the first channel 20 of the second component 14, as is shown in FIG. 5. The first connector 40 is secured in place in the first channel 20 of the second component 14 by one of the bolts or screws 58, 60, 74, which is passed through the countersunk bore 54 of the first connector 40 and engages with the complementary bore 36 of the first channel 20.

Figure 6:
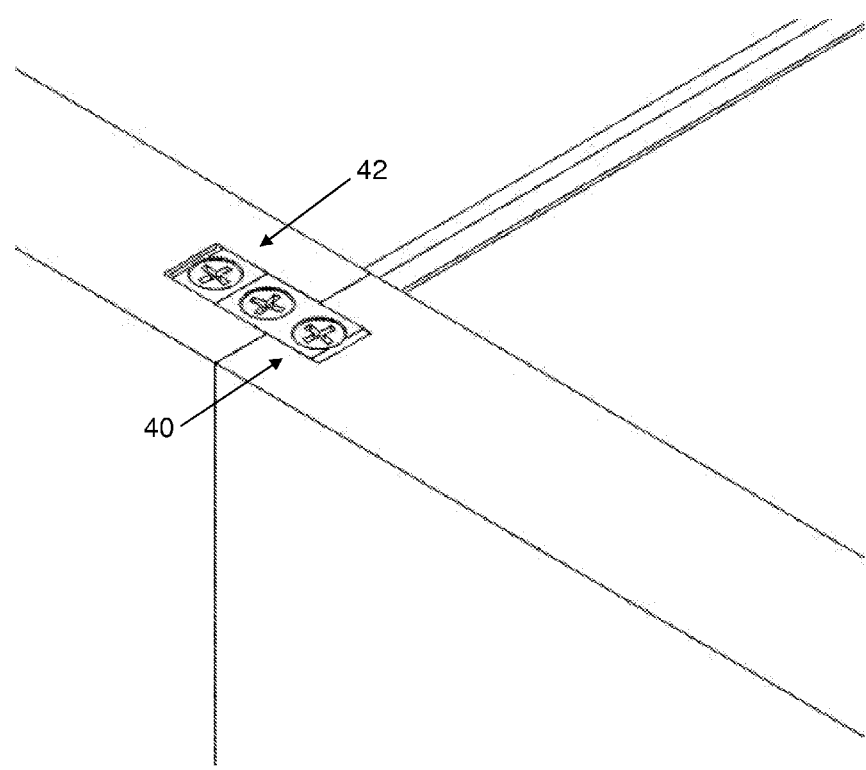
FIG. 6 is a schematic perspective view of the parts of the pieces of electrical equipment shown in FIG. 3, showing the pieces of electrical equipment locked together.
Figure 7:
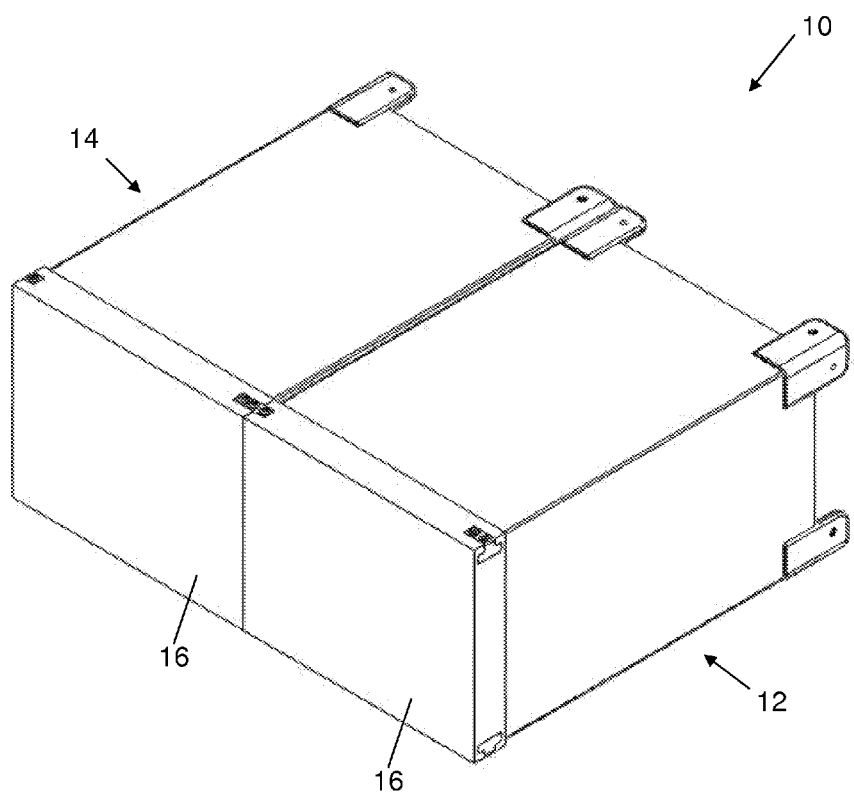
FIG. 7 is a schematic perspective view of the pieces of electrical equipment illustrated in FIG. 1 locked together.

The first component 12 is then brought into engagement with the second component 14 such that the protruding half of the first connector 40 is received in the second channel 24 of the first component 12, and the first connector 40 is secured in place by one of the bolts or screws 58, 60, 74, which passes through the countersunk bore 52 of the first connector 40 and engages with the complementary bore of the second channel 24 of the first component. Thus, the first and second components 12, 14 are locked together, as shown in FIGS. 6 and 7, such that they can be manipulated as a single component.

The use of threaded fasteners such as bolts or screws 58, 60, 74 to secure the first and second connectors 40, 42 in the first and second channels 20, 24 of the components 14, 12 facilitates the process of locking the components 12, 14 together, as no special tools are required to complete the process.

It is to be appreciated that the locking process has been described here by reference to the connectors 40, 42 and channels 20, 24 of the upper parts of the first and second sides 18, 22 of the fascias 16 of the first and second components 12, 14, but that the same process applies to the connectors and channels in the lower parts of the fascias 16 of the first and second components 12, 14. Moreover, although the first and second components 12, 14 can be locked together satisfactorily using only the upper or lower connectors and channels, a more secure connection is provided if the upper and lower connectors and channels are both used to lock the first and second components together.

As well as the side by side configuration described above, components can also be securely stacked together by means of alternative connectors, as will be described below with reference to FIGS. 8 to 12.

Figure 8:
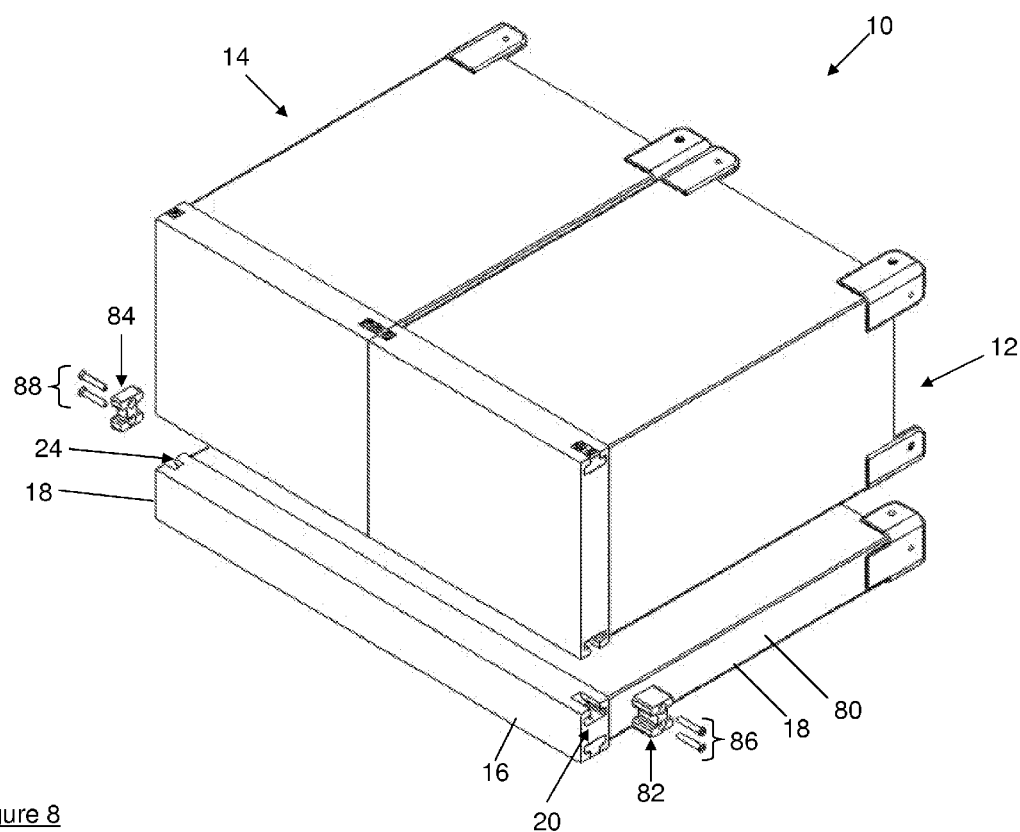
FIG. 8 is a schematic perspective view of the pieces of electrical equipment shown in FIG. 7 prior to being locked to a further piece of electrical equipment.

FIG. 8 shows first and second components 12, 14 which have been locked together as described above. These components are to be locked to a third component 80 in a stacked configuration. Like the first and second components 12, 14, the third component has a fascia 16 which is provided at a first side 18 with upper and lower first channels 20 and at a second side 22 with upper and lower second channels 24. The upper and lower first and second channels 20, 24 of the third component 80 have the same shape and configuration as those of the first and second components 12, 14.

Figure 10:
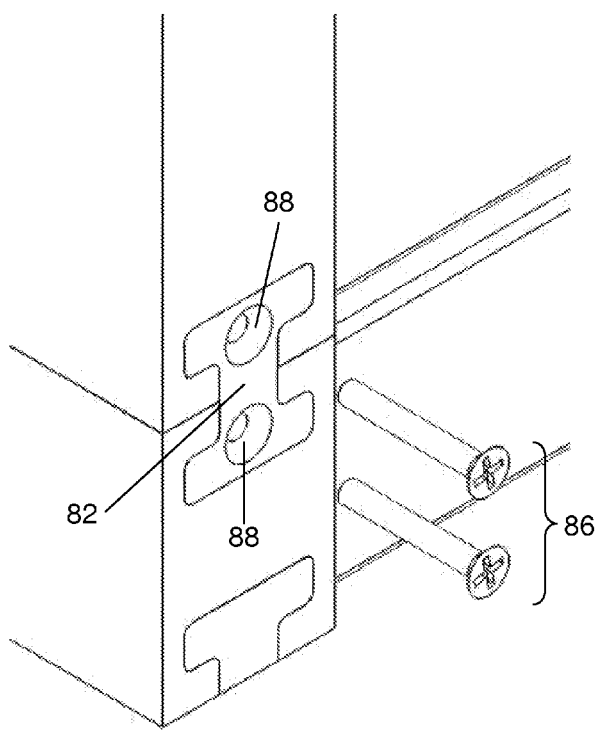
FIG. 10 is a schematic perspective view of a schematic perspective view of parts of the pieces of electrical equipment shown in FIG. 9, illustrating a further step in the process of locking the pieces of electrical equipment together.

In order to securely lock the first and second components 12, 14 to the third component in the stacked configuration shown in FIG. 10 third and fourth connectors 82, 84 are provided. The third connector 84 is generally I-shaped in cross section, having a central body portion which is provided at each end with a head portion from which arms extend laterally outwardly in opposite directions.

The third connector 82 may be regarded as two of the T-shaped first connectors 40 whose body portions 44 are connected at their free ends to form the I-shaped third connector 82. Thus, the third connector 82 is configured to be received in the first channel 20 of the components 12, 14, 80 such that when so received half of the body portion and one of the head portions are received in the first channel 20 whilst the other half of the body portion and the other head portion protrude outwardly of the first channel 20 in a direction generally perpendicular to the direction of the first channel 20.

Similarly, the fourth connector 84 may be regarded as being two of the T-shaped second connectors 42 whose body portions 62 are connected at their free ends to form an I-shaped connector 84. Thus, the fourth connector 82 is configured to be received in the second channel 24 of the components 12, 14, 80 such that when so received half of the body portion and one of the head portions are received in the second channel 24 whilst the other half of the body portion and the other head portion protrude outwardly of the second channel 24 in a direction generally perpendicular to the direction of the second channel 24.

Figure 9:
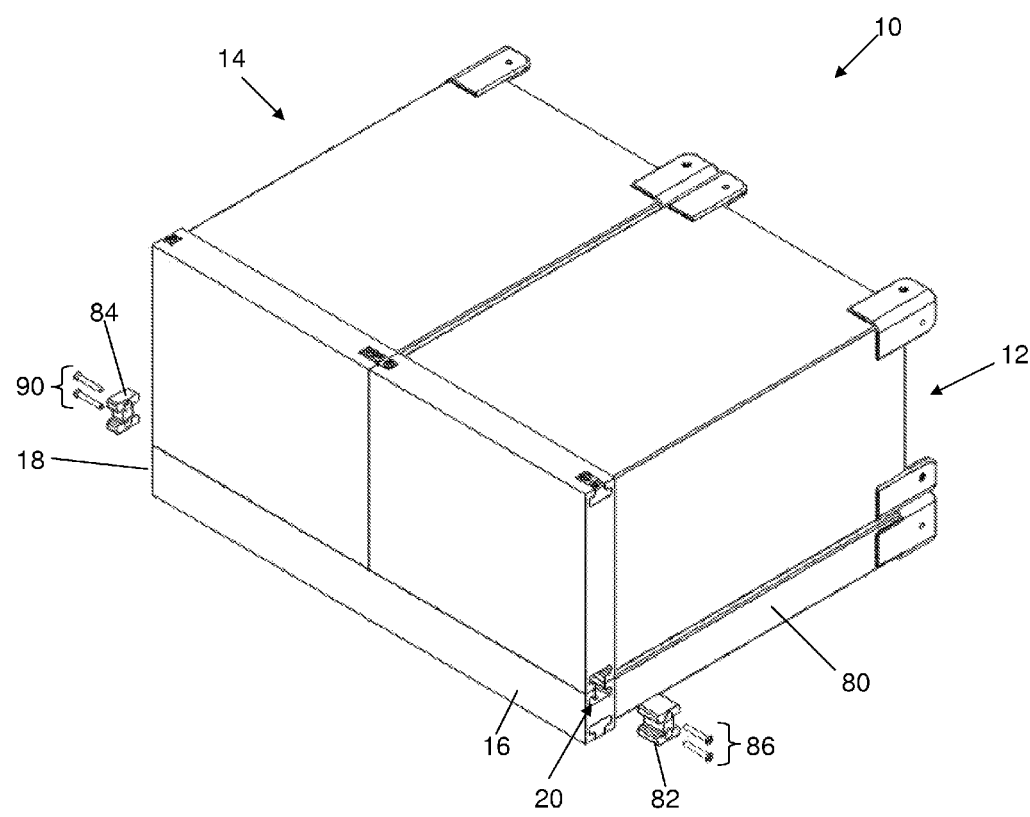
FIG. 9 is a schematic perspective view of the pieces of electrical equipment shown in FIG. 8, illustrating a step in a process of locking the pieces of electrical equipment together.

As can be seen from FIGS. 8 and 9, the fourth connector 84 is half the width of the third connector 82. Thus, when the third connector 82 is received in the first channel 20 of a component 12, 14, 80, its outer edge lies flush with the outer edge of the first side 18 of the component 12, 14, 80, whilst when the fourth connector 84 is received in the second channel 24 of a component 12, 14, 80 its outer edge lies flush with the outer edge of the second side 22 of the component 12, 14, 80.

Figure 12:
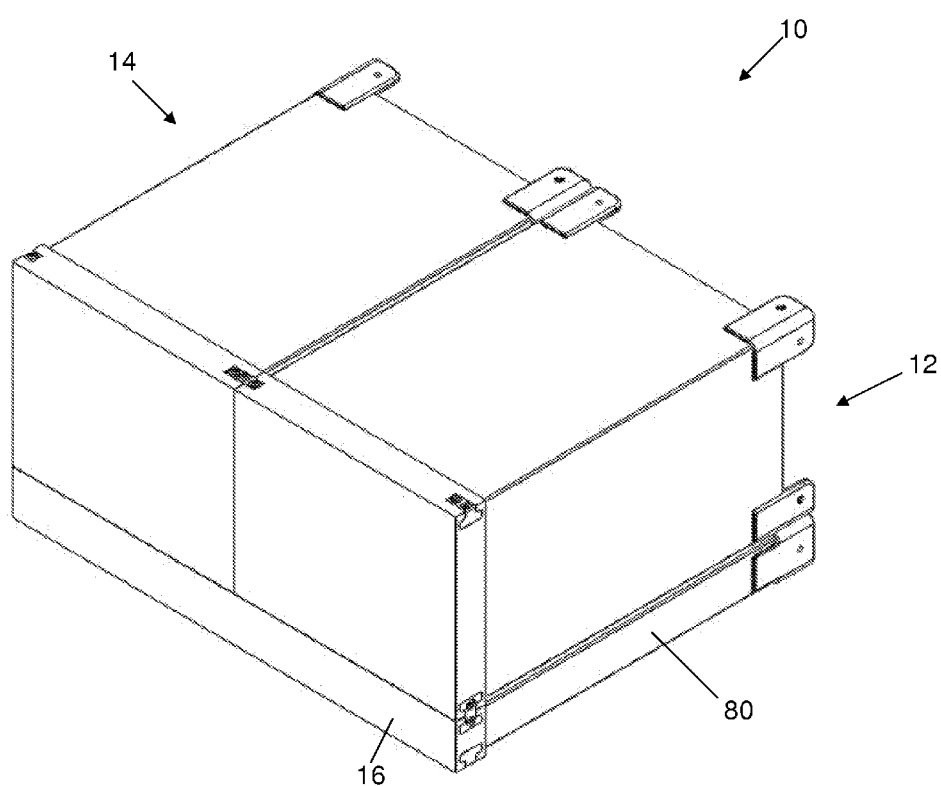
FIG. 12 is a schematic perspective view of the pieces of electrical equipment shown in FIG. 8, showing the pieces of electrical equipment locked together.

To connect the first and second components 12, 14 to the third component 80 in the stacked configuration shown in FIGS. 9 and 12, the first connector 40 is removed from the lower first channel 20 of the second component 14, and the second connector 42 is removed from the lower second channel 24 of the first component 12. The first and second connectors 40, 42 are also removed from the upper first and second channels 20, 24 of the third component 80.

The first and second components 12, 14 are then positioned on top of the third component 80, as shown in FIG. 9, such that the lower first channel 20 of the second component 14 and the upper first channel 20 of the third component form a first generally I-shaped channel, whilst the lower second channel 24 of the first component 12 and the upper second channel 24 of the third component 80 form a second generally I-shaped channel. As the second generally I-shaped channel is formed by the two second channels 24, its depth is half that of the first generally I-shaped channel.

Figure 11:
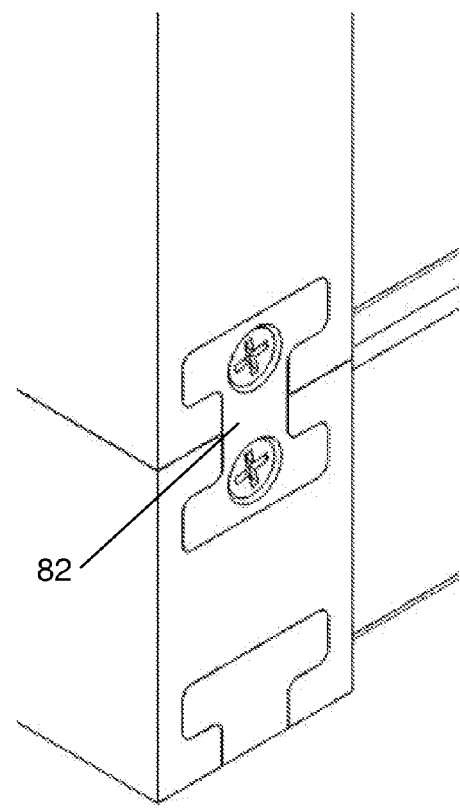
FIG. 11 is a schematic perspective view of is a schematic perspective view of the parts of the pieces of electrical equipment shown in FIG. 10, showing the pieces of electrical equipment locked together.

The third connector 82 is inserted into the first generally I-shaped channel and threaded bolts or screws 86 are passed through countersunk bores 88 in the two head portions to engage with the complementary bores 34 in the first channels 20 of the second component 14 and the third component 80 to lock the components 14, 80 together at their first sides 18, as is shown in FIGS. 10 and 11. Similarly, the fourth connector 84 is inserted into the second generally I-shaped channel and threaded bolts or screws 90 are passed through countersunk bores in the two head portions to engage with the complementary bores in the second channels 24 of the first component 12 and the third component 80 to lock the components 12, 80 together at their second sides 22.

The connectors 40, 42, 82, 84 described above are generally T- or I-shaped in cross-section, as this shape provides a strong and stable connection, since a plurality of bearing faces of the connectors 40, 42, 82, 84 are in contact with the channels 20, 24, which impedes relative movement between the components 12, 14, 80 which are locked together. However, it will be appreciated that alternative configurations of connectors and channels having in cross-section a body portion and a head portion which extends outwardly of the body portion are equally suitable for the purpose of securely locking components together. For example, the channels and connectors could be substantially L-shaped, C-shaped or keyhole shaped in cross-section, and thus the invention is not limited to a particular cross-sectional shape of channel and connector.

Figure 13:
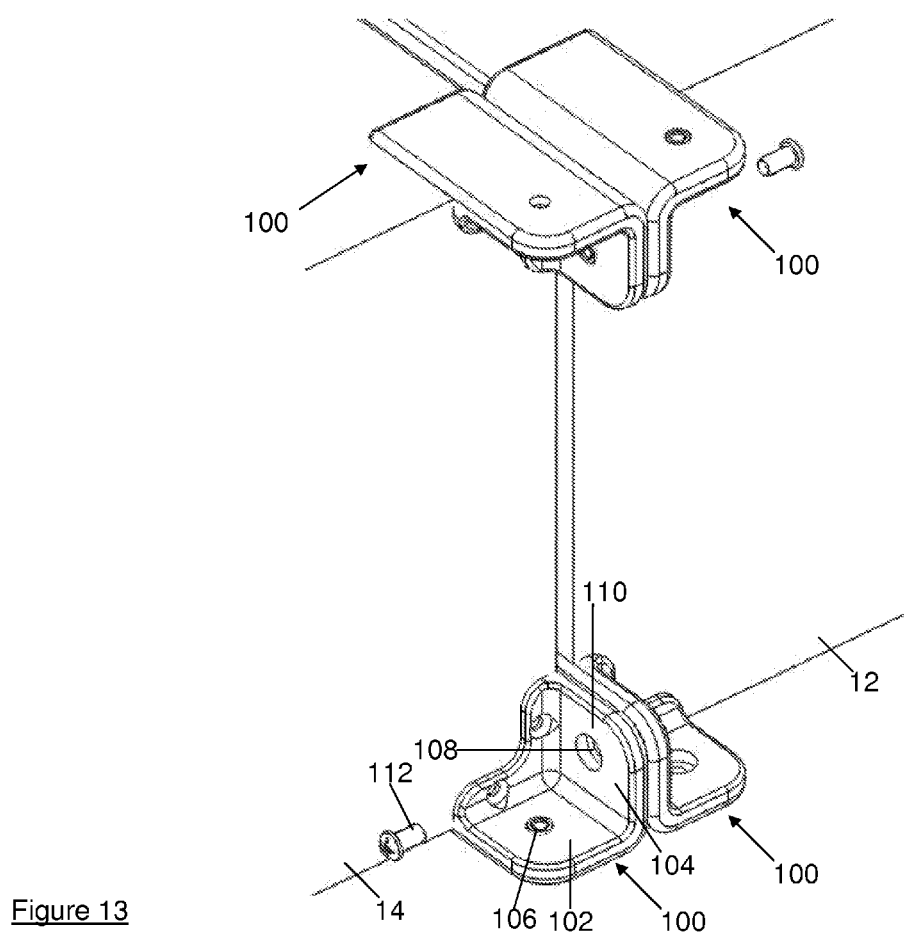
FIG. 13 is equipment shown in FIG. 1, illustrating a foot assembly of the pieces of equipment.

The first and second components 12, 14 are also provided with feet 100, which, as shown in FIG. 13, are mounted on rear corners of the first and second components 12, 14, and provide an additional means of locking the first and second components 12, 14 together, as will be described below.

As can be seen in FIG. 13, the feet 100 are generally L-shaped, having a first side 102 and a second side 104 which are of a generally similar size and shape and which are mounted generally at right angles with respect to one another.

A bore is provided in the first side 102 and contains a captive nut 106, whilst a through bore 108 is provided in the second side 104. The through bore 108 is enlarged on an inner face 110 of the second side 104 such that a head of a threaded fastener such as a bolt or screw 112 can be received in the enlarged portion of the through bore 108.

The captive nut 106 and the through bore 108 are equidistant from the angle of the L-shaped foot 100 such that when an outer face of the first side 102 of a foot 100 of the first component 12 abuts an outer face of the second side 104 of a foot 100 of the second component 14, as shown in FIG. 13, the through bore 108 and the captive nut 106 are aligned such that a threaded bolt or screw 112 can be passed through the through bore 108 to engage with the captive nut 106 to lock the first component 12 and the second component 14 together, with a head of the bolt or screw 112 being received in the enlarged portion of the through bore 108 on the inner face 110 of the second side 104 of the foot 100.

It will be appreciated that all of the feet 100 of the first and second components 12, 14 are identical, and thus are mounted on the rear corners of the components 12, 14 in different orientations. This ensures that when the components are to be locked together in the side by side configuration shown in FIG. 13, the sides 102, 104 of the feet 100 of the first component 12 abut against complementary sides 104, 102 of the feet of the second component 14 such that a threaded bolt or screw 112 can be used to lock the feet 100 of the first and second components 12, 14 together.

Figure 14:
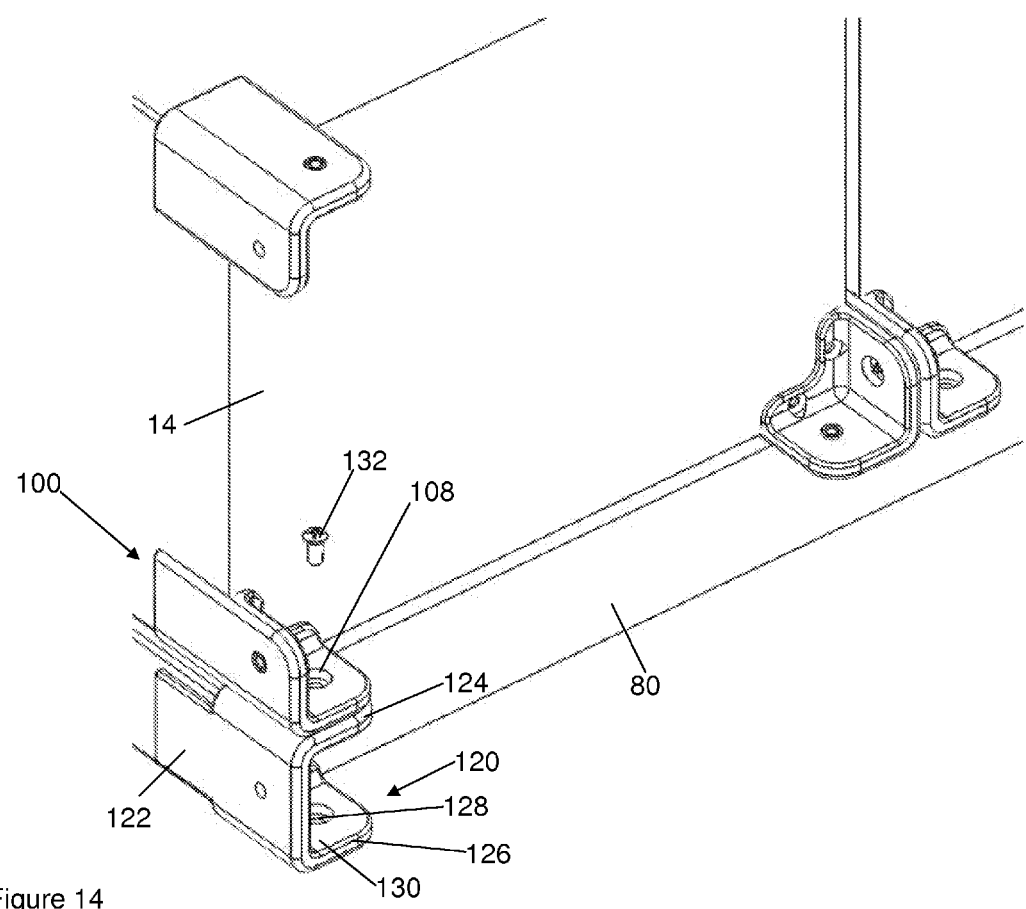
FIG. 14 is a schematic view perspective of rear parts of the pieces of electrical equipment shown in FIG. 8, again illustrating a foot assembly of the pieces of equipment.

FIG. 14 shows an alternative foot 120 which may be used for shallower components such as the third component 80, and can be used to lock such components to other components 12, 14.

As can be seen from FIG. 14, the feet 120 of the third component 80 are generally C-shaped, having a central portion 122 from which upper and lower arm portions 124, 126 extend generally perpendicularly. The upper arm portion 124 is provided with a bore containing a captive nut, whilst the lower arm portion 126 is provided with a through bore 128 which is enlarged on an inner face 130 of the lower arm portion 126. As is shown in FIG. 14, the captive nut is positioned such that when the third component is arranged in a stacked configuration with other components 12, 14, the captive nut aligns with a through bore 108 of a foot 100 of another component 14, such that a threaded bolt or screw 132 can be passed through the trough bore 108 to engage with the captive nut of the foot 120 of the third component 80 to lock the third component 80 to the component 14.

The third component 80 is supplied with a further foot at its opposite side. The further foot is identical to the foot 120, and is thus mounted to the third component 80 in an orientation which is offset by 180 degrees from that of the foot 120, such that the arm portion containing the captive nut is at a lower end of the foot and the arm portion containing the through bore is at an upper end of the foot. This use of a single design of foot 120 in different orientations ensures that when components 80, 12, 14 are to be locked together in the stacked configuration shown in FIG. 14 a through bore 128 of the foot 120 will always align with a captive nut 106 of a foot 100 at one side of the component 80, whilst at the other side of the component 80 a captive nut of a foot 120 will align with a through bore 108 of a foot 100, such that the components 80, 12, 14 can be securely locked together.

What is claimed is:

1. A component of a modular component system, the component having at a first side thereof a first channel for receiving a connector and at a second side thereof a second channel for receiving a connector, wherein:
    the first channel extends inwardly of an outer edge of the first side and in cross-section has a body portion which extends from an opening in the component in a direction generally parallel to the first side and a head portion which extends outwardly of the body portion; and
    the second channel extends inwardly of an outer edge of the second side and in cross-section has a body portion which extends from an opening in the component in a direction generally parallel to the second side and a head portion which extends outwardly of the body portion, wherein the first channel extends inwardly to a greater depth than the second channel, such that a first connector for connecting the component to a complementary component of the modular component system can be retained in the first channel and a second connector, which has a smaller width than the first connector, can be retained in the second channel.

2. A component according to claim 1 wherein the first channel extends inwardly to twice the depth of the second channel.

3. A component according to claim 1 wherein the first and second channels are each provided with a threaded bore which extends inwardly into the component in a direction generally parallel to a side of the component for receiving a threaded fastener.

4. A component according to claim 2 wherein the first channel is provided with two threaded bores which extend inwardly into the component in a direction generally parallel to a side of the component for receiving threaded fasteners.

5. A component according to claim 1 wherein the first channel and the second channel are each provided with a threaded bore which extends inwardly into the component in a direction generally perpendicular to a side of the component for receiving a threaded fastener.

6. A component according to claim 1 wherein the first and second channels are generally T-shaped in cross-section.

7. A component according to claim 1 further comprising a first connector which is removably received in the first channel and a second connector which is removably received in the second channel.

8. A component according to claim 1 further comprising a foot having a first side and a second side, the first side being provided with a threaded aperture and the second side being provided with a through bore for receiving a threaded fastener.

9. A component according to claim 8 wherein the through bore is enlarged on an inner face of the second side.

10. A component according to claim 8 wherein the foot is generally L-shaped.

11. A component according to claim 8 wherein the foot is generally C-shaped.

12. A component according to claim 1 wherein the component is a piece of electronic test equipment.

13. A connector for connecting components of a modular system according to claim 1, the connector having a body portion and a head portion which extends outwardly of the body portion.

14. A connector according to claim 13 having a through bore which extends through the connector in a direction generally perpendicular to an upper surface of the connector.

15. A connector according to claim 14 having two through bores which extend through the connector in a direction generally perpendicular to an upper surface of the connector.

16. A connector according to claim 14 wherein each though bore is countersunk.

17. A connector according to claim 13 wherein the connector is generally T-shaped in cross-section.

18. A connector according to claim 13 wherein the connector is generally I-shaped in cross-section.

19. A connector according to claim 18 having through bores which extend through the connector in a direction generally parallel to an upper surface of the connector.

20. A fascia for a component of a modular system, the fascia having at a first side thereof a first channel for receiving a connector and at a second side thereof a second channel for receiving a connector, wherein:
    the first channel extends inwardly of an outer edge of the first side and in cross-section has a body portion which extends from an opening in the fascia in a direction generally parallel to the first side and a head portion which extends outwardly of the body portion; and
    the second channel extends inwardly of an outer edge of the second side and in cross-section has a body portion which extends from an opening in the fascia in a direction generally parallel to the second side and a head portion which extends outwardly of the body portion, wherein the first channel extends inwardly to a greater depth than the second channel, such that a first connector for connecting the component to a complementary component of the modular component system can be retained in the first channel and a second connector, which has a smaller width than the first connector, can be retained in the second channel.

* * * * *